(12) United States Patent
Pickett (10) Patent No.: US 9,165,246 B2
(45) Date of Patent: Oct. 20, 2015

(54) NEURISTOR-BASED RESERVOIR COMPUTING DEVICES

(71) Applicant: HEWLETT-PACKARD DEVELOPMENT COMPANY, L.P., Houston, TX (US)

(72) Inventor: Matthew D. Pickett, San Francisco, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 279 days.

(21) Appl. No.: 13/753,152

(22) Filed: Jan. 29, 2013

(65) Prior Publication Data

US 2014/0214738 A1   Jul. 31, 2014

(51) Int. Cl.
G06N 3/04    (2006.01)
G06N 3/063   (2006.01)

(52) U.S. Cl.
CPC .................... *G06N 3/0635* (2013.01)

(58) Field of Classification Search
None
See application file for complete search history.

(56) References Cited

U.S. PATENT DOCUMENTS

| | | | |
|---|---|---|---|
| 3,333,118 A | | 7/1967 | Cote, Jr. |
| 3,599,009 A | * | 8/1971 | Parmentier et al. ............ 706/38 |
| 5,942,912 A | | 8/1999 | Thewes et al. |
| 2009/0187736 A1 | * | 7/2009 | Raichelgauz et al. .......... 712/36 |

OTHER PUBLICATIONS

Kulkarni, M. "Memristor-based Reservoir Computing." Portland State University (Jan. 2012). [retrieved Dec. 17, 2014]. [retrieved from pdxscholar.library.pdx.edu].*

Kulkarni, M., et al. "Memristor-based reservoir computing." Nanoscale Architectures (NANOARCH), 2012 IEEE/ACM International Symposium on. IEEE, 2012.*

Pershin, Y., et al. "Experimental demonstration of associative memory with memristive neural networks." Neural Networks 23.7 (2010): pp. 881-886.*

Kudithipudi, D., et al. "Design of Neuromorphic Architectures with Memristors." Network Science and Cybersecurity. Springer New York, 2014. pp. 93-103.*

Strukov, D., et al. "Hybrid CMOS/memristor circuits." ISCAS. 2010.*

Schrauwen, B., et al. "An overview of reservoir computing: theory, applications and implementations." Proceedings of the 15th European Symposium on Artificial Neural Networks. p. 471-482 2007.*

LukošEviĉlus, Mantas et al. "Reservoir computing approaches to recurrent neural network training." Computer Science Review 3.3 (2009): 127-149.

Mass, Raytheon Co Waltham. "Neuristor Logic Technology." (Jun. 1964). http://oai.dtic.mil/oai/oai?verb=getRecord&metadataPrefix=html&identifier=AD0602656.

* cited by examiner

*Primary Examiner* — Kakali Chaki
*Assistant Examiner* — Eric Nilsson
(74) *Attorney, Agent, or Firm* — Van Cott, Bagley, Cornwall & McCarthy (57) ABSTRACT

A neuristor-based reservoir computing device includes support circuitry formed in a complimentary metal oxide semiconductor (CMOS) layer, input nodes connected to the support circuitry and output nodes connected to the support circuitry. Thin film neuristor nodes are disposed over the CMOS layer with a first portion of the neuristor nodes connected to the input nodes and a second portion of the neuristor nodes connected to the output nodes. Interconnections between the neuristor nodes form a reservoir accepting input signals from the input nodes and outputting signals on the output nodes. A method for forming a neuristor-based reservoir computing device is also provided.

20 Claims, 5 Drawing Sheets

Fig. 6

NEURISTOR-BASED RESERVOIR COMPUTING DEVICES

BACKGROUND

Reservoir computing describes a broad range of recurrent neural networks, including liquid state machines and echo state networks. Reservoir computing uses a collection of recurrently connected units called a reservoir. Inputs are accepted by the reservoir and mapped to a higher dimension. The state of the reservoir can then be read to determine the desired output. Reservoir computing offers the potential for efficient parallel processing and nonlinear signal discrimination. For example, reservoir computing can be used to efficiently solve a number of tasks that are deemed computationally difficult, such as identifying features images, predicting chaotic time series, and speech recognition.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Neuristor-based reservoir computing offers the potential for efficient parallel processing and nonlinear signal discrimination. For example, reservoir computing can be used to efficiently solve a number of tasks that are deemed computationally hard, such as identifying features images, predicting chaotic time series, modeling robotic movements based on sensory inputs, hand writing recognition and speech recognition.

Reservoir computing uses a collection of recurrently connected units called a reservoir. In some implementations, the units within the reservoir computer may be neuristors or elements that exhibit neuron-like behavior. Biological neurons use signal transduction that is mediated in large part by sodium and potassium ion channels that dynamically permit or prevent polarizing currents to charge or discharge through the cell membrane. If a cell body is sufficiently polarized though its dentritic inputs, the ion channels change conductance markedly and a voltage spike, or action potential, is triggered that travels along the axon. This all-or-nothing spiking is one of the fundamental principles of computation in biology. Computationally simulating the use of neuristors in reservoir computing networks in software has been computationally expensive. No hardware constructions of a neuristor-based reservoir computing device are known.

In one example, memristors can be used to form hardware implementations of neuristors and reservoir computers directly in hardware. A variety of memristor types could be used. For example, Mott insulators, such as $NbO_2$, exhibit threshold switching that can be used to directly produce hardware elements with the "all-or-nothing" behavior of biological neuristors. The mechanism for "all-or-nothing" switching in Mott insulators is current-controlled negative differential resistance. This phenomenon is caused by a reversible insulator-to-metal phase transition that occurs when sufficient current is driven through the device to locally heat some of the material above its transition temperature. This induces a conductive channel in the device that bridges the two electrodes. Injecting sufficient energy into the device to heat the material requires measurable time. Thus, these memristors exhibit dynamic resistance that is dependent on excitation history.

This property of the Mott memristors allows them to serve as electronic analogs of axon action potential and to form the basis of a neuristor with threshold driven spiking, lossless propagation at a constant velocity, uniform spike shape, and a refractory period. From a technological standpoint, neuristors based on Mott memristors have advantages of switching rapidly (less than about one nanosecond), exhibiting a low transition energy (less than about 100 femto joules), scale to at least tens of nanometers, are compatible with conventional front or back-end complementary metal-oxide-semiconductor (CMOS) materials and processes, and can be fabricated on a wide range of substrates. These current controlled devices do not have the limitations of voltage controlled negative differential devices such as Esaki diodes. Esaki diodes require inductors to operate, and consequently cannot be integrated at the nanoscale.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

The term "parametrically random" refers to randomness within certain constraints. For example, a connection between a first node and a second node may be randomly selected to be connected, but the trace that forms the interconnection between the first node and second node is constrained by the physical dimensions of the circuit of which the first node and second node are a part. Other parameters that may constrain the random nature of interconnections may be layout design rules. These design rules may include specific distances between conductive traces and that a trace may not intersect itself. In some examples, the interconnections may be further constrained by global parameters that define characteristics of the population of interconnections. For example, these global parameters may include defining an average number of connections per node, maximum allowable interconnection distance, mean electrical resistance for the interconnections, or other global parameter.

Figure 1:
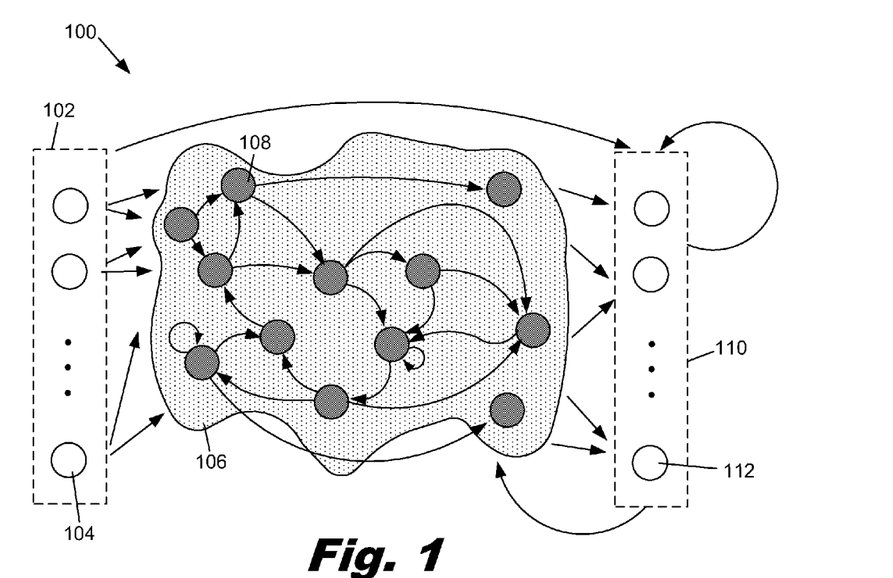
FIG. 1 is a diagram of neuristor-based reservoir, according to one example of principles described herein.

FIG. 1 is a diagram of a neuristor-based computing reservoir structure (100) that includes a number of inputs (102), reservoir (106), and a number of outputs (110). The input (102) includes a number of input nodes (104). In some examples, these input nodes may be vias passing from an underlying complementary metal-oxide-semiconductor (CMOS) layer upward into the overlying reservoir layer. The connections between the input nodes and the reservoir may be random, parametrically random, or structured. One input node may connect to one or multiple neuristor nodes (108) within the reservoir (106). Additionally, some input nodes (104) may be connected directly to an output node, another input node, or may not be connected to any other node.

Typically, the reservoir includes a large number of neuristor nodes and interconnections. These neuristor nodes map the input signals to a higher dimension. The parametrically random nature of these interconnections produces a wide range of computation effects that can be exploited to analyze the inputs. Inside the reservoir (106), the neuristor nodes are highly interconnected and form a variety of feedback connections that return a certain output to a node or nodes that originally generated the output. This produces feedback loops of the reservoir "resonate" in response to a given input, set of inputs, or time sequence of inputs. These resonances and other computational effects of in the reservoir can be used to analyze the inputs in a parallel, extremely fast, and computationally efficient manner.

The outputs (110) are used to determine the state of the reservoir or portions of the reservoir, including resonances within feedback loops in the reservoir. The connections between the output nodes (112) and the reservoir may also be parametrically random or structured. Output nodes may also be connected to other outputs and directly to inputs. In some implementations, the distinction between an input and output is blurred, with the same node serving as an input node or an output node depending on the circumstances.

Figure 2:
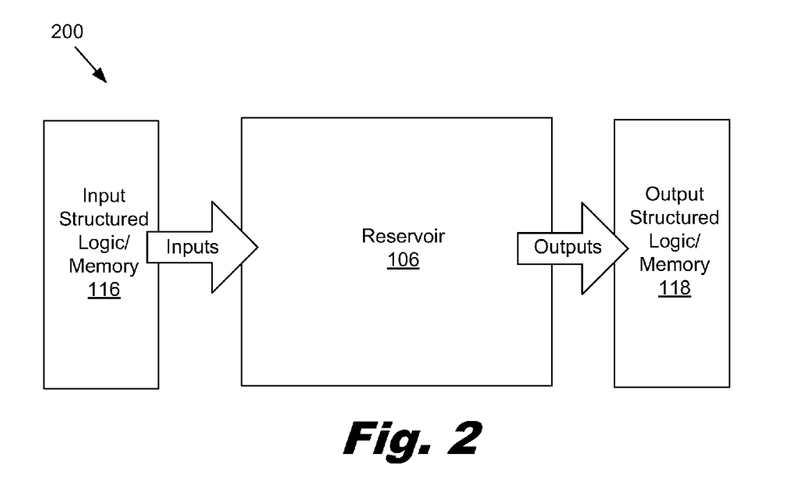
FIG. 2 is diagram of the computational flow in a neuristor based reservoir computer, according to one example of principles described herein.

FIG. 2 shows a specific implementation of a reservoir computer (200) that includes structured logic/memory (116) that is implemented in CMOS or other conventional circuitry to provide inputs and support to the reservoir (106). In some examples, the structured logic/memory provides interfaces to computational processors, addressing to specific input nodes, memory to store inputs or instructions, multiplexers/demultiplexers, transistors to selectively activate input nodes, voltage supplies, and other functions. The reservoir (106) accepts the inputs from the structured logic/memory (116). Output structured logic/memory (118) reads the state of the reservoir (106). Using the state of the reservoir, conclusions can be drawn about the input signals.

As discussed above, there may be some blurring between input and output nodes, with some nodes being used as both input and output nodes. Similarly, the same logic/memory may be used for both input and output. In one example, an input signal is inserted into the reservoir by a first node and then the result of the computation by the reservoir is sampled using the same node.

Learning and adaptive computing can be accomplished in a variety of ways. In one example, the characteristics of the connections and/or neurons in the reservoir may be altered. For example, memristors may be incorporated into the reservoir, either in the neuristor nodes or in the connections between nodes. These memristors can be programmed to remember specific stimuli and may adapt the function and interconnection of the neuristor nodes to perform the desired function or produce the desired output.

In other implementations, the logic/memory (116, 118) may be reprogrammed to alter the location/combination of inputs to produce the desired output. In these implementations the neuristor nodes and interconnections between the neuristor nodes may have fixed characteristics and the architecture of the neuristor reservoir remains static over time. For example, if a first node is connected to the second node by a trace with specific electrical resistance, the first node and second node remain connected by that trace with its electrical resistance throughout the lifetime of the device. However, because the neuristor-based reservoir layer is connected to CMOS circuitry, the inputs into the reservoir layer can be altered to produce the desired output. For example, if a signal representing spoken words is input into the reservoir computer, specific feedback loops will resonate when specific words or sounds are spoken. The output from those feedback loops identifies when the feedback loops resonate. This "computation" process is very efficient and very fast. The neuristor-based reservoir computer can "learn" to output the desired identification of spoken words by adjusting the inputs over which the signals are input to the reservoir and/or associating output by the reservoir with specific words or patterns.

Figure 3:
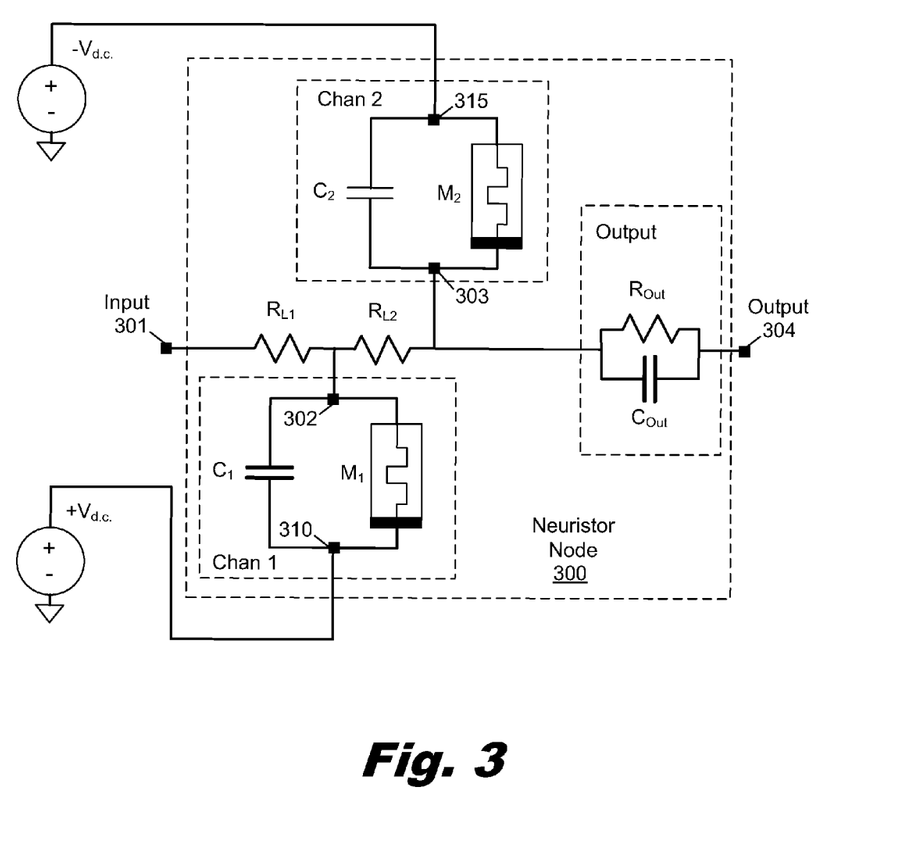
FIG. 3 is circuit diagram of a neuristor node, according to one example of principles described herein.

FIG. 3 is a lumped circuit diagram of one neuristor node (300) within a reservoir that uses two nominally identical Mott memristors ($M_1$ and $M_2$). In parallel with each of the Mott memristors is a capacitor ($C_1$ and $C_2$). The two channels are energized (d.c.-biased) with opposite polarity voltages, similar to the sodium and potassium channels of a biological neuron. The channels are coupled to each other through a load resistor ($R_{L2}$). The circuit has an input resistance ($R_{L1}$) and an output impedance ($R_{out}$ and $C_{out}$). This circuit is described by four coupled first-order differential equations that define four dynamic state variables for the system. These four state variables are: the normalized metallic channel radii ($u_1$, $u_2$) of the memristors ($M_1$, $M_2$) and the charges ($q_1$, $q_2$) stored in the capacitors ($C_1$, $C_2$). When a sub-threshold input voltage is applied, the response of the neuristor is minimal. However, when a super-threshold input is applied, the output of the neuristor is substantially greater. For example, if the threshold of the neuristor is about 0.25 volts, the application of a sub-threshold input voltage of 0.2 V for 10 microseconds may result in an output of tens of milli-volts. However, if the input voltage is 0.3 volts the output of the neuristor may be a voltage spike with a peak of greater than 0.3 volts. Thus, the memristor-based neuristor exhibits both signal gain and thresholding. The charging/discharging of the capacitors control time delay that mimics the refractory period of biological systems. Interaction between the two memristors is mediated by resistor $R_{L2}$. The system also produces constant spike amplitude/shape and constant velocity propagation through multiple neuristors connected in series. The amplitude and shape of the output pulse is determined by the electrical characteristics of the neuristor and the applied voltages ($+V_{d.c.}$ and $-V_{d.c.}$). The amplitude and shape of the output pulse is independent of the input. The input functions solely to trigger firing by the neuristor. The principles described above provide for a transistor-free neuromophic architecture.

Figure 4:
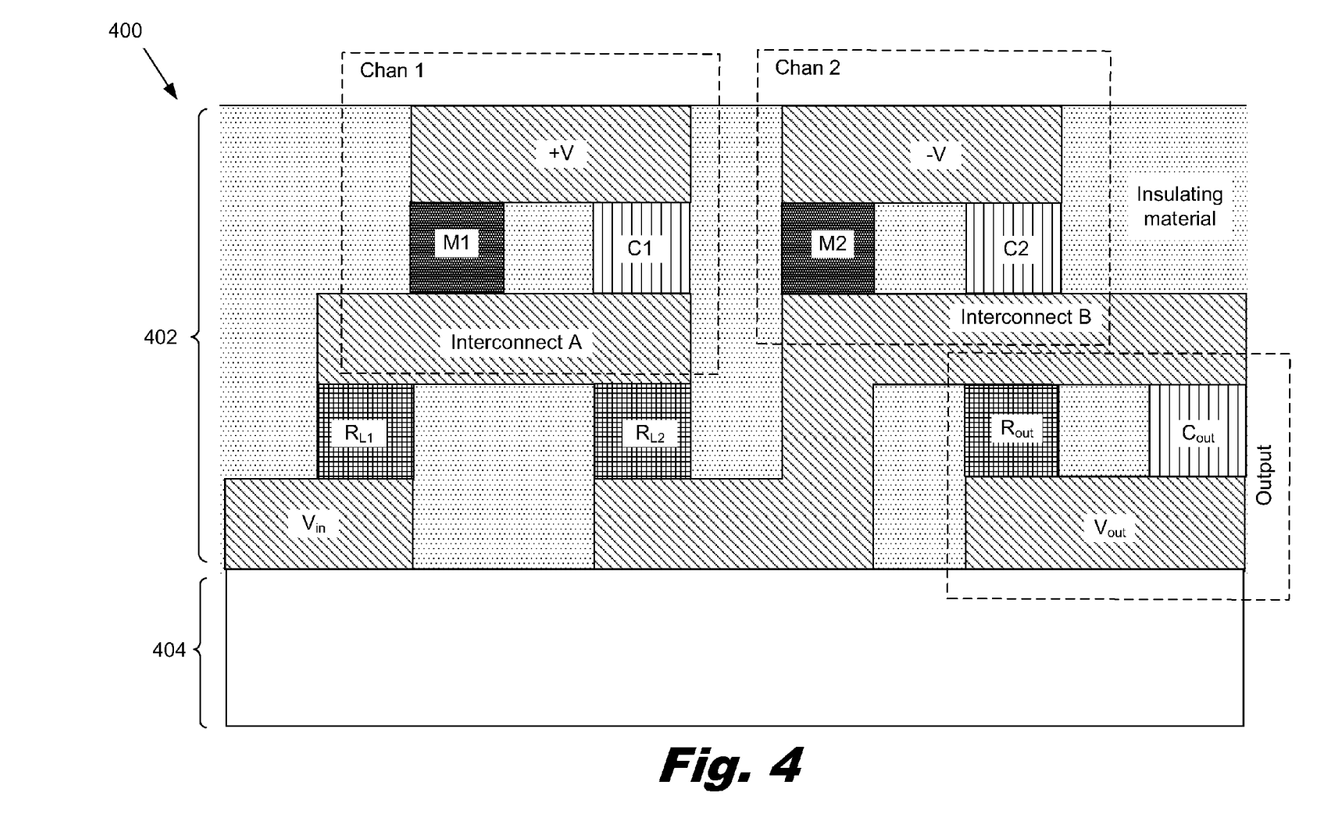
FIG. 4 is a cross sectional diagram of a hardware implementation of a neuristor node within a neuristor-based reservoir computer, according to one example of principles described herein.

FIG. 4 shows a cross sectional diagram of a multilayer circuit (400) that implements the lumped circuit shown in FIG. 3. The multilayer circuit (400) is a small portion (node 300, FIG. 3) of a neuristor-based reservoir computer. In this example, the neuristor-based reservoir computer (400) includes two main sub-parts: the CMOS support circuitry (404) and the reservoir (402). As discussed above, the CMOS support circuitry (404) may provide a variety of functions and elements such as transistors, voltage supplies, multiplexer/demultiplexers, communication lines, addressing, communication interfaces, memory, processors, and other elements/functions. The multilayer circuit (400) is formed over the support circuitry (404) and connections are made to the underlying support circuitry by disposing contacts ($V_{in}$, $V_{out}$) over appropriate locations of the support circuitry.

The reservoir (402) may be formed using thin film deposition and patterning techniques over the CMOS layer. The reservoir includes conductive layers ($V_{in}$, $V_{out}$, V+, V−, Interconnect A, Interconnect B), negative differential resistance (NDR) memory elements (M1, M2), resistors ($R_{L2}$, $R_{out}$), and capacitive elements (C1, C2, and $C_{out}$). The conductive layers ($V_{in}$, $V_{out}$, V+, V−, Interconnect A, Interconnect B) may be formed from a variety of conductive materials, including metals, metal oxides, metallic nitrides, transparent conductive oxide, or other conductive material or combination of materials. As non-limiting examples, the conductive layers can be formed from titanium nitride, tantalum nitride, copper, aluminum, or platinum. The NDR memristors (M1, M2) can be formed from a variety of current-controlled negative differential resistance materials. Non-limiting examples include oxides of strontium, oxides of barium, oxides of transition metals, or some combination thereof. The transition metal can be at least one of Sc, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, Pt, La, Ce, Pr, Nd, Sm, Eu, Gd, Tb, Dy, Ho, Er, Tm, Yb, and Lu. In another non-limiting example, the current-controlled negative differential resistance material can be a chalcogenide glass or may include organic material. These memristors are also known as Mott memristors because of the metal-non-metal Mott transition that results in large differences in conduction as a function of the applied voltage/current.

An insulating material surrounds and separates the various elements. The insulating material can be an oxide of silicon, an oxide of aluminum, an oxide of titanium, or some combination thereof. In an example, the insulating material can be a dielectric material that is non-stoichiometric. For example, the dielectric material can be $SiO_2$, AlO, or $TiO_2$ that is slightly off stoichiometry to form a memristive matrix with mobile dopants. The conductive layers can be interspersed with dielectric material using a lithographic process to form isolated sections of conductive material.

The multilayer circuit (400) creates the neuristor node (300) shown in the circuit diagram in FIG. 3. The biasing voltage +$V_{d.c.}$ is applied upper +V conductive element and the biasing voltage −$V_{d.c.}$ is applied to −V conductive element. In this example, the input to the neuristor node at the lower left $V_{in}$ element. The resistance $R_{L1}$ is interposed between interconnect A and the input $V_{in}$. Point 302 in FIG. 3 is formed by interconnect A. The +V conductive element forms the point 315 in FIG. 3. Capacitor C1 and the Mott memristor M1 are sandwiched between interconnect A and the +V conductive element/layer. The capacitor C1 and Mott memristor M1 make up channel 1.

The lumped resistance $R_{L2}$ and interconnect B link channel 1 with channel 2. Channel 2 is formed by a second Mott memristor M2 and a capacitor C2 that are sandwiched between interconnect B and the negative voltage layer −V. The output is formed by an output resistor $R_{out}$ and an output capacitor $C_{out}$. The signal output of the neuristor node is at the $V_{out}$ conductive layer and is available for transmission, storage, or manipulation by the CMOS layer 404.

The NDR memristors ($M_1$, $M_2$) are biased by the applied voltages such that they are close to their activation thresholds but remain in the OFF state. When a voltage pulse is applied to the input line, the current-driven insulator-metal transition in the NDR material can be activated if the input exceeds a threshold. This turns the Mott memristors ($M_1$, $M_2$; FIG. 3) to an ON state. The Mott memristors have a non-linear response to the application of voltage pulses. When voltage pulses that have a magnitude or duration that is less than a threshold are applied, the Mott memristors do not respond. When voltage pulses that exceed the threshold are applied, conductive pathways are created between the one of the conductive layers and the central layer and the Mott memristor turns on.

For example, an input pulse is applied to the input point (301, FIG. 3). This pulse exceeds the threshold to switch Channel 1 from the OFF state to the ON state. The application of the input pulse allows conductive pathways to form in the NDR layer and make an electrical connection between the lower conductive layer (315, FIG. 3) and the second conductive portion (302, FIG. 3). This applies a negative electrical voltage to point 302 in FIG. 3. This negative voltage biases channel 2 so that it also switches from an OFF state to an ON state. Specifically, the voltage difference between point 303 and point 310 is great enough to trigger the metal-insulator transition in the Mott memristor $M_2$. The switching of the channels from their OFF to ON states is not immediate and is moderated by the capacitors C1 and C2. The output point 304 receives the output signal generated by firing of the neuristor node.

When an input is received that is below the threshold, a minimal output voltage is generated. This minimal output voltage is typically substantially lower than the input voltage because the resistances ($R_{L1}$, $R_{L2}$, and $R_{out}$) effectively block the input voltage. As discussed above, when the input voltage exceeds the threshold for switching the Mott memristor in channel 1 to the ON state, this triggers the neuristor to fire. Thus, the output signal first spikes in a negative direction when the first Mott memristor $M_1$ switches ON and connects +$V_{d.c.}$ to the interconnect A. After a short delay (induced by the charging of capacitor $C_1$) the output voltage swings negative when the first Mott memristor $M_1$ becomes conductive and connects +$V_{d.c.}$ to the point 302. This negative voltage is pulls point 303 lower and induces switching of second Mott resistor. After a short delay (during charging of capacitor $C_2$) the output swings positive when the second Mott memristor $M_2$ becomes conductive and connects −$V_{d.c.}$ to the point 303.

After triggering, the Mott memristors return to their OFF state and the firing of the neuristor is complete. The neuristor as described above has many of similar characteristics to a biological neuron, including "all-or-nothing" firing, signal delay, and a refractory period.

The neuristor and neuristor based reservoir computer can accept analog or digital input. For example, the neuristor may accept digital data from a memory or a processor. Additionally or alternatively, a neuristor may accept analog data directly from a sensor. In some examples, the sensor may be integrated into the same chip as the neuristor.

Figure 5:
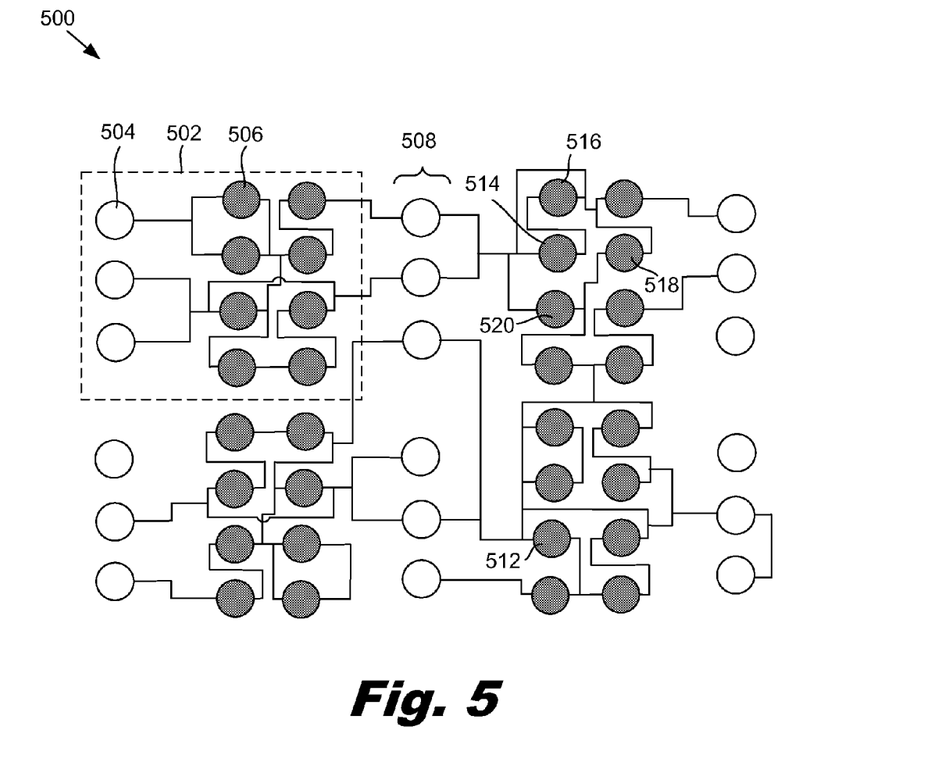
FIG. 5 is a diagram of a small portion of a neuristor-based reservoir computer, according to one example of principles described herein.

FIG. 5 is one example of a neuristor reservoir (500) that is implemented according to the principles discussed above. The inputs/outputs (504) are shown as open circles and neuristor nodes (506) are shown as shaded circles. In this example, the input/output (504) and neuristor nodes (506) are shown as being regularly spaced and is a quasi-grid pattern. The neuristor reservoir (500) grid pattern is subdivided into repeated units (502). This regular layout may facilitate the density and addressing of the underlying CMOS components. However, interconnections between the various input, outputs, and neuristor nodes may be parametrically random, which covers the range from totally random (where the parameters are not constraining) to partially random (where the parameters constrain at least a portion of the connections or specific aspects of the connections). For purposes of illustration only a small number of inputs, outputs, and neuristor nodes are shown. Neuristor reservoirs would typically contain large numbers of neuristor nodes. The neuristor reservoirs may be constructed in with any suitable layout, including larger or smaller sub-units, sub-units that vary in size, layouts that are not grid-like, or another layout that facilitates the desired interconnections. In general, the layout of the neuristor reservoir is principally limited by the processes and material that are used to form the neuristor reservoir. In some examples, the neuristor reservoir may take the form of a crossbar array having at least one crossbar layer. In some examples there may be little distinction between input/output nodes. For example, the intermediate nodes (508) in FIG. 5 may be used as input or output nodes, or may be both input and output nodes simultaneously.

In general, the neuristor nodes are highly interconnected and form a number of feedback loops that can resonate in response to specific input signals or time sequences. For example, a neuristor node (512) is directly connected to three input/output nodes and approximately thirteen neuristor nodes. One simple resonant feedback loop is formed by neuristor nodes (514) and (516). The following description assumes that the inputs to the neuristors are on the left and outputs are on the right. However, in some designs this designation is arbitrary. As can be seen from the cross section in FIG. 4, this example of a neuristor node would operate based on an input from either the right hand or left hand vias. Returning to FIG. 5 and using the input/output designation described above, node (514) receives an input from one of two input points and responds with an output (if the input exceeds the switching threshold). The output of node (514) is routed to the input of node (516), which outputs a signal that is directed to three other neuristor nodes, including node (514). If conditions are right (i.e. the input from node (516) is received by the node (514) when it is not in its refractory period), the signal continues to resonant between nodes (514) and (516) until it dissipates or is disrupted by another input (i.e. a second input signal is received by node (514) so that the resonating signal from node (516) is received during the refractory period).

The nodes (514) and (516) also participate in a second resonant feedback loop that includes nodes (518) and (520). The signals in this feedback loop will resonate more slowly than then previously discussed loop because of the greater delay introduced by the greater number of nodes.

As discussed above, the characteristics of the neuristor nodes and interconnections in the reservoir may be fixed or variable. In a fixed configuration, the reservoir remains static and the signals associated with the inputs/outputs are altered to produce the desired computation within the reservoir. In other implementations, the characteristics of the interconnections may be variable. For example, the interconnections may include a variable resistor (such as a nonvolatile memristor) or a fuse. The electrical resistance of the connection can then be altered by changing the resistance of the connection to decrease the weight of the inputs received over this connection. If the connection includes a fuse, the fuse can be blown to eliminate that particular connection. In FIG. 4, the dielectric elements (440) may be memristors that have a programmable resistance that is stable over predetermined time and voltage ranges.

Figure 6:
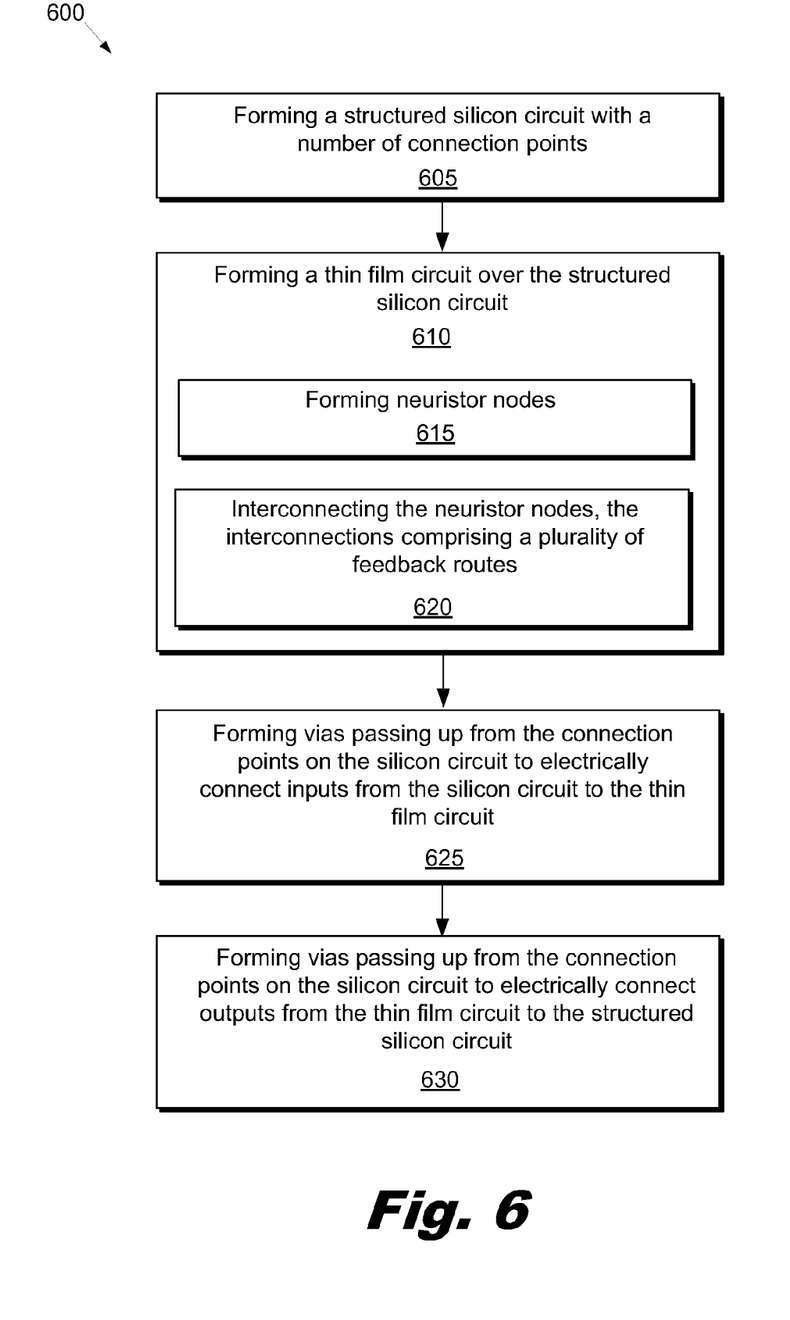
FIG. 6 is a flowchart of a method for forming a neuristor-based reservoir computing device, according to one example of principles described herein.

FIG. 6 is a flowchart of a method for forming a neuristor-based reservoir computing device that includes forming a structured silicon circuit with a number of connection points (block 605) and forming a thin film circuit over the structured silicon circuit (block 610). The thin film circuit is formed by forming neuristor nodes (block 615) and interconnecting the neuristor nodes, the interconnections forming a plurality of feedback routes between the neuristor nodes (block 620). The neuristors may include negative differential memristor elements that are current controlled. In some examples, the neuristors may be designed to have the same performance subject to manufacturing variations. In other examples, the neuristors may be designed to have varying performance. For example, the resistance or capacitance values within a neuristor may be intentionally varied to produce the desired variation in delay and threshold characteristics.

The interconnections may be parametrically random connections between the neuristor nodes. Parameters applied to the connections may include a maximum path length, an average number of connections between nodes, and an average number of nodes along any given path to connect an input to an output. The electrical resistance of the various connections may also be parametrically random. The parameters that influence the electrical resistance of the connections may include the length of the trace, the thickness of the trace, the width of the trace, the material that makes up the trace, and the resistance of any resistive elements in the trace. In some examples, the thickness of the trace may be fixed and the nominal width of the trace defined, but the length of the trace may vary. If resistive elements are included in the interconnections, the electrical resistance of the resistive elements may be random, programmable or fixed. For example, programmable resistive elements may be memristors.

The thin film circuit may include a number of domains and sub-domains. In one example, the interconnections within a sub-domain are random while the arrangement of the various sub-domains is structured.

Vias are formed that pass upward from the connection points on the silicon circuit to electrically connect inputs from the silicon circuit to the thin film circuit (block 625). Vias are also formed that pass up from connection points on the silicon circuit to electrically connect output from the thin film circuit to the structured silicon circuit (block 630).

This results in a neuristor-based reservoir computing device that includes silicon based (CMOS) support circuitry layer, input and output nodes connected to the support circuitry, thin film neuristor nodes disposed over the CMOS layer and interconnections between the neuristor nodes to form a reservoir accepting input signals from the input nodes and outputting signals to on the output nodes.

Learning by the neuristor-based reservoir computing device may include altering, with the structured silicon circuit, the use of the inputs to the thin film circuit to achieve the desired output from the thin film circuit.

The principles and methods described above can be applied to form and use neuristor-based computing devices. The neuristors are directly matched to the requirements of reservoir computing including signal delay, high degrees of parallelization and nonlinear signal discrimination. The reservoir includes a large number of highly interconnected neuristors implemented in a thin film circuit. The interconnections between these nodes may be parametrically random and have varying weights. The interconnections created a high degree of feedback within the reservoir. The neuristor-based computing devices can be used for a variety of computing tasks including parallel processing and nonlinear signal discrimination.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A neuristor-based reservoir computing device comprising:
    support circuitry formed in a complementary metal oxide semiconductor (CMOS) layer;
    input nodes connected to the support circuitry;
    output nodes connected to the support circuitry;
    thin film neuristor nodes disposed over the CMOS layer, a first portion of the neuristor nodes connected to the input nodes and a second portion of the neuristor nodes connected to the output nodes; and interconnections between the neuristor nodes to form a reservoir accepting input signals from the input nodes and outputting signals on the output nodes.

2. The computing device of claim 1, in which the interconnections between the neuristor nodes are parametrically random.

3. The computing device of claim 1, in which the interconnections between the neuristor nodes have parametrically random electrical resistances.

4. The computing device of claim 1, in which the neuristor nodes comprise negative differential resistance elements.

5. The computing device of claim 4, in which the neuristor nodes comprise current-controlled negative differential resistance materials.

6. The computing device of claim 1, further comprising a memristor interposed between a neuristor node and an interconnection, the electrical resistance of the memristor determining a degree of activation/inhibition in a connection between the neuristor-based element and interconnection.

7. The computing device of claim 1, in which neuristor nodes in the reservoir computer are divided into structured sub-domains, in which connections between the neuristor nodes in a sub-domain are parametrically random.

8. The computing device of claim 1, in which the neuristor nodes each have the same design performance.

9. A neuristor-based reservoir computing device comprising:
support circuitry formed in a complementary metal oxide semiconductor (CMOS) layer;
input nodes connected to the support circuitry;
output nodes connected to the support circuitry;
thin film neuristor nodes disposed over the CMOS layer, a first portion of the neuristor nodes connected to the input nodes and a second portion of the neuristor nodes connected to the output nodes; and
interconnections between the neuristor nodes to form a reservoir accepting input signals from the input nodes and outputting signals on the output nodes;
in which the neuristor nodes each comprise a first channel comprising:
interconnect layer to receive an input signal;
an upper conductor to receive a biasing voltage;
a negative differential resistance (NDR) memristor; and
a capacitor, in which the memristor and the capacitor are sandwiched between the interconnect layer and upper conductor.

10. The computing device of claim 9, in which the NDR memristor and capacitor are electrically parallel, in which charging of the capacitor induces delay in the NDR memristor switching behavior.

11. The computing device of claim 10, in which an input signal from an input node is received by the interconnect layer, such that when a voltage difference between the input signal and a bias voltage applied to the upper conductor exceeds a threshold, the NDR memristor becomes conductive and generates an intermediate output signal.

12. The computing device of claim 11, further comprising a second channel comprising:
a second interconnect layer;
a second upper conductor receiving a biasing voltage;
a second NDR memristor;
a capacitor, in which the second NDR memristor and the capacitor are sandwiched between the second interconnect layer and second upper conductor, in which the second interconnect layer receives the intermediate output signal.

13. The computing device of claim 9, in which the neuristor nodes comprise Mott memristors.

14. A neuristor-based reservoir computing device comprising:
support circuitry formed in a complementary metal oxide semiconductor (CMOS) layer;
input vias passing upward from the support circuitry;
output vias passing upward from the support circuitry;
thin film neuristor nodes disposed over the CMOS layer, a first portion of the neuristor nodes connected to the input vias and a second portion of the neuristor nodes connected to the output vias, in which the neuristor nodes comprise:
interconnect layer receiving an input signal;
an upper conductor receiving a biasing voltage;
a negative differential resistance (NDR) memristor; and
a capacitor, in which the memristor and the capacitor are sandwiched between the interconnect layer and upper conductor; and
parametrically random interconnections between the neuristor nodes to form a reservoir accepting input signals from the input nodes and outputting signals on the output nodes.

15. A method for forming a neuristor-based reservoir computing device, the method comprising:
forming a structured silicon circuit with a number of connection points;
forming a thin film circuit over the structured silicon circuit by:
forming neuristor nodes; and
interconnecting the neuristor nodes, the interconnections comprising a plurality of feedback routes;
forming vias passing up from the connection points on the silicon circuit to electrically connect inputs from the silicon circuit to the thin film circuit; and
forming vias passing up from the connection points on the silicon circuit to electrically connect outputs from the thin film circuit to the structured silicon circuit.

16. The method of claim 15, in which learning by the neuristor-based reservoir circuit comprises altering, with the structured silicon circuit, the inputs to the thin film circuit to achieve the desired output from the thin film circuit.

17. The method of claim 15, further comprising designing parametrically random interconnections between the neuristor nodes within parametric parameters.

18. The method of claim 17, in which the parametrically random interconnections between the neuristor nodes comprise random connections is at least one sub-domain of the thin film resistor.

19. The method of claim 17, in which the neuristors are divided into sub-domains, in which interconnections with in the sub-domains are subject to different parametric parameters than interconnections between the sub-domains.

20. The method of claim 15, in which interconnecting the neuristor nodes comprises building resistance elements with parametrically random electrical resistances into the interconnections.

* * * * *